US006911928B2

(12) United States Patent
Orsier et al.

(10) Patent No.: US 6,911,928 B2
(45) Date of Patent: Jun. 28, 2005

(54) BANDPASS SIGMA-DELTA MODULATOR AND USES OF THE SIGMA DELTA MODULATOR FOR CONVERSION, DETECTION AND PRODUCTION OF SIGNALS

(75) Inventors: Elisabeth Orsier, Grenoble (FR); Marc Belleville, St Egreve (FR); Cyril Condemine, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/473,504

(22) PCT Filed: Apr. 9, 2002

(86) PCT No.: PCT/FR02/01229

§ 371 (c)(1),
(2), (4) Date: Apr. 19, 2004

(87) PCT Pub. No.: WO02/084884

PCT Pub. Date: Oct. 24, 2002

(65) Prior Publication Data

US 2004/0169437 A1 Sep. 2, 2004

(30) Foreign Application Priority Data

Apr. 11, 2001 (FR) .............................................. 01 04977

(51) Int. Cl.[7] .............................................. H03M 3/00
(52) U.S. Cl. ...................................... 341/143; 341/155
(58) Field of Search ........................ 341/143; 375/245; 327/568

(56) References Cited

U.S. PATENT DOCUMENTS

| | | | | |
|---|---|---|---|---|
| 5,181,032 A | * | 1/1993 | Ribner | 341/143 |
| 5,283,578 A | * | 2/1994 | Ribner et al. | 341/143 |
| 5,757,301 A | * | 5/1998 | Kuo et al. | 341/143 |
| 6,075,820 A | * | 6/2000 | Comino et al. | 375/245 |
| 6,121,910 A | * | 9/2000 | Khoury et al. | 341/143 |
| 6,271,781 B1 | * | 8/2001 | Pellon | 341/143 |
| 6,621,331 B2 | * | 9/2003 | Pobanz et al. | 327/568 |

FOREIGN PATENT DOCUMENTS

| | | | |
|---|---|---|---|
| EP | 1 324497 A1 | * 12/2001 | |
| WO | 98/27402 | 6/1998 | ........... G01C/19/56 |
| WO | 01/10033 | 2/2001 | ............ H03M/1/34 |

OTHER PUBLICATIONS

Stapleton (U.S. Appl. No. 10/003,725), "High Efficiency Power Amplifier Systems and methods", filed Oct. 30, 2001.*

Botteron et al., "An Investigation of Bandpass Sigma–Delta A/D", 1997, IEEE, pp. 293–296.

Bourouina et al., "Preliminary Results on a Silicon Gyrometer Based on Acoustic Mode Coupling in Small Cavities", Dec. 1997, IEEE, Journal of Microelectromechanical Systems, vol. 6, No. 4, pp 347–354.

(Continued)

*Primary Examiner*—Jean Bruner Jeanglaude
(74) *Attorney, Agent, or Firm*—Thelen Reid & Priest LLP

(57) ABSTRACT

A sigma-delta modulator comprising:
  at least one resonator (100a, 110b),
  a converter (120) to convert an analogue signal from the resonator into a digital signal with time information, and
  a feedback loop connecting an output of the converter to an excitation input of the resonator.

According to the invention, at least one resonator in the modulator is chosen from among the group comprising mechanical, acoustic, electromechanical, electrostatic, optical and chemical resonators. Application to analogue-digital conversion, signal detection and signal generation.

15 Claims, 4 Drawing Sheets

OTHER PUBLICATIONS

Cao et al., "High–Accuracy Circuits for On–Chip Capacitance Ratio Testing or Sensor Readout", Sep. 1994, IEEE, Transactions on Circuits and Systems—II: Analog and Digital Signal Processing, vol. 41, No. 9, pp. 637–639.

Daniel, et al., "BandPass Sigma–Delta Modulator for Wideband IF Signals", Jun. 10, 1999, 6 pp.

De la Rosa et al., "A 2.5 MHz 55dB Switched–Current BandPass $\Sigma\Delta$ Modulator for AM Signal Conversion", Instituto de Microelectronica de Sevilla–CNM, Sevilla, Spain, pp 156–159, no date.

De la Rosa et al., "CMOS fully–differential bandpass $\Sigma\Delta$ modulator using switched–current circuits", Feb. 1, 1996; Electronics Letters, vol. 32, No. 3, pp 156–157.

Francesconi et al., "A 10.7–MHz $N$–Path Fourth–Order Bandpass Sigma–Delta Modulator", Micronova Sistemi S.r.l., Pavia, Italy, Department of Electronics, University of Pavia, Pavia, Italy, pp. 216–219, no date.

Leme et al., "Multi–purpose interface for sensor systems fabricated by CMOS technology with post–processing", 1993, Sensors and Actuators A, 37–38, pp. 77–81.

Louis et al., "An Eighth–Order Bandpass $\Sigma\Delta$Modulator for A/D Conversion in Digital Radio", Apr. 1999, IEEE, Journal of Solid–State Circuits, vol. 34, No. 4, pp. 423–431.

Nguyen et al., "An Integrated SMOS Micromechanical Resonator High–Q Oscillator", Apr. 1999, IEEE Journal of Solid–State Circuits, vol. 34, No. 4, pp. 440–455.

Seibert et al., "Optical System for Pressure and Temperature Sensing", The $7^{th}$ International Conference on Solid–State Sensors and Actuators, pp. 690–693, no date.

Shum et al., "Resonantly enhanced radio frequency electrooptic phase modulator", Jan. 20, 1990, Applied Optics, vol. 29, NO.3, pp. 422–428.

* cited by examiner

BANDPASS SIGMA-DELTA MODULATOR AND USES OF THE SIGMA DELTA MODULATOR FOR CONVERSION, DETECTION AND PRODUCTION OF SIGNALS

CROSS-REFERENCE TO RELATED APPLICATION

This application claims priority based on International Patent Application No. PCT/FR02/01229, entitled "Band-Pass Sigma-Delta Modulator and Use of Sigma-Delta Modulator For Converting, Detecting and Producing Signals" by Elisabeth ORSIER, Marc BELLEVILLE and Cyril CONDEMINE, which claims priority of French application no. 01/04977, filed on Apr. 11, 2001, and which was not published in English.

Continuing Data

This application is the national phase under 35 USC 371 of PCT International No. PCT/JFR02/01229 which has an International filing date of Apr. 9, 2002 which claims priority based on French Application No. 01/04977, filed on Apr. 11, 2001.

TECHNICAL DOMAIN

This invention relates to a sigma-delta modulator, and more precisely a sigma-delta modulator comprising at least one resonator and an internal converter.

The invention also relates to the use of such a sigma-delta modulator to make analogue-digital conversion devices, devices for detection of physical magnitudes and/or signal generator devices.

Due to the very wide variety of these uses, the invention is used in applications in very many technical domains. For example, the invention can be used for processing of high frequency signals or for the generation of a reference frequency signal in communication equipment. Therefore, it can be used in a mobile telephone or similar. The invention can also be used to make physical measurement instruments, for example electromechanical, optical, acoustic, thermal or other instruments.

STATE OF PRIOR ART

Sigma-delta modulators are electronic devices that are now very frequently used in signal processing equipment. The use of sigma-delta modulators has been developed particularly for making analogue to digital signal converters. The state of the art for sigma-delta modulators, and a broader technological background of the invention, is illustrated in documents (1) to (12), for which complete references are given at the end of this description.

Known sigma-delta modulators include particularly two modulator families that are called "low-pass" and "band-pass" modulators.

Low-pass sigma-delta modulators are made essentially around one or several integrating elements. If they are associated with filter means forming at least one low-pass filter, they form so-called low-pass sigma-delta converters. Sigma-delta modulators, for example illustrated in document (1), are not illustrated here. This invention relates to bandpass sigma-delta modulators. These modulators can be associated with filter means performing at least the "band-pass" filter function, to form bandpass sigma-delta converters.

FIG. 1 attached diagrammatically shows a simplified representation of the main elements of a known type of bandpass sigma-delta converter. This is an order 2 converter. It contains a resonator that may be considered to be two integrators. The number of integrators defines the order of a sigma-delta converter.

In the sigma-delta converter 10, a distinction can be made between two main parts, namely a modulator 12 and filter means 130. An input E to the sigma-delta modulator is connected in order to an electrical resonator 16, a comparator 18 and a bandpass digital unit that in this case forms the filter means 130. The output from the sigma-delta converter corresponds to the output from the filter means 130. A feedback loop 20 connects the output from the comparator 18 to the input to the resonator 16. A mixer 15 is designed to add the input signal applied to the terminal E and the signal from the feedback loop 20. The feedback loop may also comprise components such as an internal digital-analogue converter or an amplifier. These are not shown for simplification reasons.

For example, document (3) mentioned above contains one particular example embodiment of the electrical resonator 16.

The comparator 18 is used as an internal analogue-digital converter. For example, it outputs a digital signal coded on a single bit, that has a first logical value when the analogue signal output by the electrical resonator exceeds a given threshold value, and is equal to a second logical and complementary value when the analogue signal output from the resonator is less than this threshold value. The analogue signal is thus transformed into a pulse density modulation (PDM) signal, at the output from the modulator.

The filter means 130 are of the bandpass type, and in particular their function is to eliminate quantification noise in the pulse density modulated signal inherent to transformation of the analogue signal into a quantified signal, for example quantified on comparator output levels.

When the sigma-delta modulator is used as an analogue-digital converter, the filter means 130 are digital and can also be used as a decimator, in other words for the conversion of a high frequency signal coded on a small number of bits into a signal with a lower frequency coded on a larger number of bits.

The electrical resonator 16 is characterised by its quality factor. This represents the width of a frequency band in which the amplitude of the resonance exceeds a threshold value. It is considered that the quality factor is high when the absolute value of the resonance amplitude is large and the frequency band is narrow. The threshold value is defined as being the maximum value of the resonance minus 3 dB.

The quality of the sigma-delta modulator is related to the resonator quality factor. In particular, this controls the elimination of quantification noise in the bandpass. In other words, a sigma-delta modulator equipped with a resonator with a wide resonance band, in other words with a poor quality factor, outputs an output signal with a strong quantification noise. This is the case despite filtering done by filter means 130.

One method of improving the quality of the sigma-delta modulator is to put several resonator stages in series. The result will then be a higher order sigma-delta modulator. For example, documents (3) and (4) contain further information about this subject.

However, increasing the number of modulator stages can introduce a number of difficulties. One of the main difficulties is the operating stability of the sigma-delta modulator. Other difficulties are related to possible interference between electrical resonators and other electrical components.

Finally, an increase in the number of sigma-delta modulator stages results in an increased consumption of electrical energy that may be incompatible with portable equipment power supply sources.

PRESENTATION OF THE INVENTION

The purpose of this invention is to propose a sigma-delta modulator that does not have the limitations of the devices mentioned above.

One particular purpose is to propose a sigma-delta modulator with a very low quantification noise, while having a limited number of resonators.

Another purpose is to propose a sigma-delta modulator insensitive to interference with surrounding electrical or electronic circuits, particularly in high frequency applications, but which is compatible with constraints related to portable equipment.

Finally, another purpose of the invention is to propose several specific applications of the sigma-delta modulator corresponding to its features.

More precisely, the purpose of the invention is a sigma-delta modulator comprising:

at least one resonator, an internal converter to convert an analogue signal from the resonator into a digital signal with time information, a feedback loop connecting an output from the resonator to an excitation input to the resonator.

Note that the invention may be used not only with a linear resonator, it may also be used with a non-linear resonator.

According to the invention, at least one resonator in the sigma-delta modulator is chosen among the group comprising mechanical, acoustic, electromechanical, electrostatic, optical and chemical resonators.

A resonator means a device that can come into resonance in a resonance band excluding zero frequency and that has a negligible response to excitation at a frequency outside the resonance band. For example, it is considered that a response is negligible when its amplitude is at least 10 dB below the amplitude of a response with gain 1.

The resonator used in the sigma-delta modulator according to the invention is not an electronic or electrical resonator. This means that resonance in itself is not an electrical or electronic phenomenon. However, note that the resonator excitation signal or the resonator output signal may be electrical signals. The fact that the resonator is not electrical or electronic significantly reduces interference with surrounding electronic circuits, regardless of whether they operate at high or low frequency. Furthermore, for example, it is found that the quality factors of mechanical or optical resonators are usually much higher than the quality factors of electrical resonators. Excellent elimination of quantification noise can thus be achieved even with a small number of resonator stages.

The sigma-delta modulator according to the invention may comprise one or several resonators. As mentioned above, at least one of these resonators is not an electrical resonator. However, this does not mean that this resonator cannot be used with several other electronic or non-electronic resonators.

When the excitation input and/or the resonator output are not electric, the resonator may be associated with at least one electrical interface, in other words a device capable of converting physical signals, for example mechanical, optical or acoustic signals, into electrical signals, or vice versa. In particular, this provides a means of making the output compatible with the filter means.

Note also that if the resonator input is not an electrical input, it is still possible to excite the resonator directly by a physical excitation signal. In this case, an electrical interface is not necessary at the resonator input.

On the other hand, when the feedback loop outputs an electrical signal and the excitation input is physical, the feedback loop may be connected to the excitation input, through an electromechanical interface, an electro-optical interface or an electro-acoustic interface for the signal. These aspects will be discussed in more detail in the remainder of the disclosure.

The bandpass filter means, like in conventional sigma-delta converters, are designed to filter quantification noise and possibly to decimate the signal. They may comprise one or several filter elements with global behaviour similar to a bandpass filter. The band is also conventionally adjusted with respect to the band of the resonator.

The internal converter of the sigma-delta modulator is a device capable of outputting a digital signal with timed information. It is a relatively high frequency signal coded on a small number of bits, for example on a single bit. The information is then at least partly contained in a more or less important density of pulses. Such an internal converter, also denoted an analogue-digital converter, may be merely a comparator that will be used to compare an amplitude of the analogue signal from the resonator with one or several threshold values. Therefore, this internal analogue-digital converter should not be confused with the analogue-digital conversion function performed by a sigma-delta modulator associated with the digital filter means. This aspect will be described in further detail in the remainder of the disclosure.

In one particular embodiment of the sigma-delta modulator, the resonator may be a free oscillator. In this case, it is equipped with a reaction loop connecting its output to its input. This loop may also be provided with amplifying or comparison means.

According to another aspect, the resonator may be a maintained resonance resonator, for example an oscillator maintained by an external excitation signal.

According to one improvement, the sigma-delta modulator according to the invention may be equipped with a regulation loop connecting an output from the modulator to the excitation input of the resonator. This loop may be combined with filter means of a regulator and/or a comparator to compare the output signal, or a characteristic of the output signal, with a set value or signal. The regulation loop's main function is then to stabilize the behaviour of the modulator, for example when it is used to generate a signal.

The invention also relates to an analogue-digital conversion device for a signal comprising an analogue signal input and a sigma-delta converter as described previously. The analogue signal input is then connected to the resonator excitation input. The signal applied to the resonator input is an analogue signal to be converted. The term "signal" is used in a very general sense that does not exclude application of a continuous and invariable signal to the converter input. The converter may be used in any application to convert a signal originating from a signal source, or a voltage originating for example from a measurement instrument, into digital values.

When the resonator excitation input is a physical input and the signal to be converted is an electrical signal, the analogue input may be connected to the excitation input through an electromechanical or electro-optical interface as already mentioned.

Another purpose of the invention is a digital or analogue signal generator comprising a sigma-delta modulator like that described above in which at least one resonator is an oscillator, and possibly filter means comprising a digital or analogue filter.

The analogue filter is capable of converting the pulse density modulated digital signal available at the output from the internal analogue-digital converter of the sigma-delta modulator, into an analogue output signal. For example, this output signal may be sinusoidal.

When the sigma-delta modulator is used as a signal generator, the resonator may be a free oscillator. In this case, no external signal is applied to the resonator excitation input. However, the resonator will still be connected to a negative feedback loop connecting its output to its excitation input. This loop transforms the resonator into a free oscillator.

The invention also relates to the use of a sigma-delta modulator in a device for measuring a physical magnitude. The measurement device comprises a detection resonator sensitive to a physical magnitude and a sigma-delta modulator like that described above.

Note that the physical magnitude to which the resonator is sensitive is not related to the excitation signal that may or may not be applied to the resonator input. The physical magnitude is a magnitude that modifies the resonance amplitude of the resonator. For example, when the resonator is a vibrating gyrometre, the physical magnitude to be measured may be a Coriolis force. For other resonators, the physical magnitude could be a temperature.

Therefore, the physical magnitude considered here is different from a physical magnitude output from a sensor external to the sigma-delta modulator and for which the analogue measurement signal is applied to the excitation input of the resonator for conversion into a digital signal. This would correspond to use of the sigma-delta modulator in an analogue-digital converter in the manner described above, and not as a measurement device in itself.

According to one particular embodiment of a measurement device according to the invention, the measurement device may comprise means of exciting the detection resonator in the form of a second resonator called an excitation resonator coupled to the detection resonator. The excitation resonator may form part of a second distinct sigma-delta modulator. The Coriolis force is one particular example of the coupling defined above.

Other characteristics and advantages of the invention will become clear after reading the following description with reference to the figures in the attached drawings. This description is given purely for illustrative purposes and is in no way limitative.

DETAILED DESCRIPTION OF EMBODIMENTS OF THE INVENTION

In the following description, identical, similar or equivalent parts of the different figures are marked with the same numeric references. Thus, it is possible to compare one figure with the other, avoiding a repetition in the description of elements already mentioned.

Figure 1:
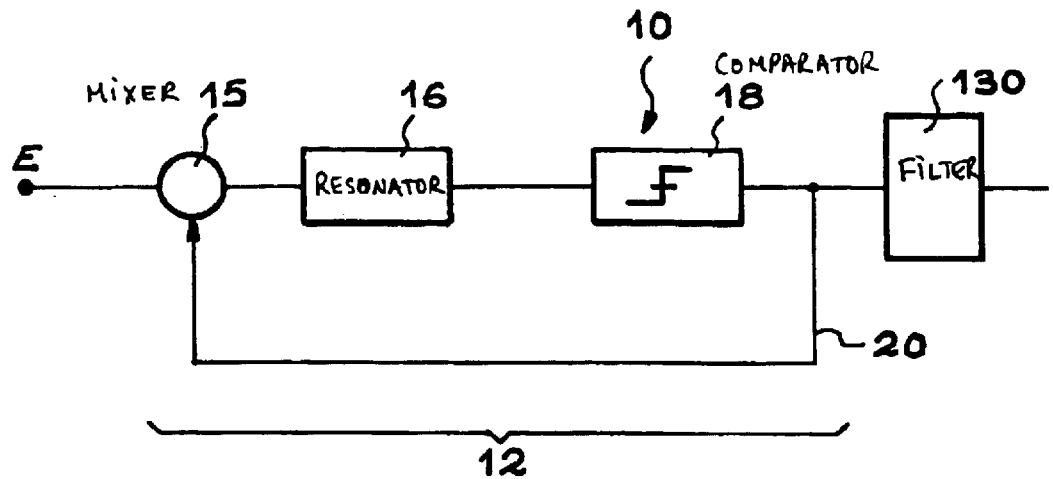
FIG. 1, described above, is a simplified diagrammatic view of a type of sigma-delta converter known in the state of the art.
Figure 2:
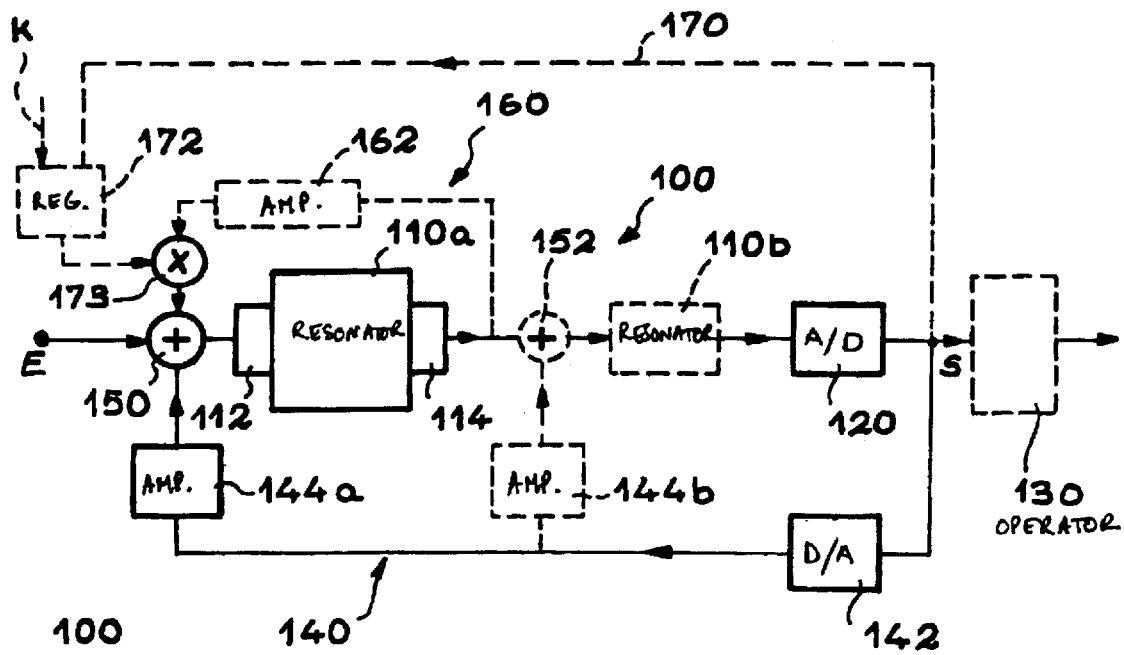
FIGS. 2 and 3 are diagrammatic views of sigma-delta modulators according to the invention.

The sigma-delta modulator 100 in FIG. 2 comprises a first resonator 110a, a second resonator 110b shown in dashed lines, and an analogue-digital converter 120, in order between an input E and an output S. A feedback loop 140 connects the output from the analogue-digital converter 120 to the input 112 of the first resonator 110a. An operator 130, shown as a dashed line, may possibly be associated with the modulator to form a sigma-delta converter.

An analogue feedback signal is formed using a digital-analogue converter 142 and is applied to the input 112 through an amplifier 144a. An adder 150 is provided to add the feedback signal to an input signal applied to the input E of the sigma-delta modulator, if there is such an input signal.

For example, the first resonator 11a is an optical, acoustic or mechanical resonator. It is provided with a first interface 112 that will transform an electrical input signal and/or an electrical feedback signal into a mechanical, acoustic or optical signal. Conversely, a second interface 114 placed at the output from the resonator 110a is designed to convert a resonating physical signal into an electrical signal, to be sent to the analogue-digital converter 120. For example, the interfaces 112 and 114 are a loudspeaker type of acoustic transducer, and a microphone when the resonator 110a is an acoustic cavity. An example of a sigma-delta modulator equipped with such a cavity is examined in more detail in the remainder of the disclosure.

The interfaces 112 and/or 114 are eliminated for an electrostatic or electromechanical type of resonator, in other words if the resonator can be excited by an electrical signal.

The second resonator 110b shown in dashed lines may be a resonator comparable with the first resonator or possibly an electrical resonator. It increases the order of the sigma-delta modulator and therefore its performances. A branch of the feedback loop 140 provided with an amplifier 144b is connected to an input to the second resonator. The feedback signal is added to the output signal from the first resonator through an adder 152.

Note that the second resonator 110b, and therefore the second amplifier 144b, may be eliminated. They may also be replaced by a larger number of resonators connected according to the same scheme in series with the first resonator 110a.

Different types of signals can be applied to the input E, depending on the use to be made of the sigma-delta modulator. For example, if it is used as an analogue-digital converter, it would be possible to apply an analogue signal or a simple voltage to it to be converted into digital values. If it is used as a signal generator or as a measurement device, an excitation signal designed to maintain a resonance can be applied to the input E. Finally, it is also possible that no external signal is applied to the input E.

The resonator 110a may be used as a free oscillator. In this case a reaction loop 160, for example equipped with an amplifier 162, is connected between the resonator output and its input. The reaction loop 160, shown in dashed lines in FIG. 2, is connected to the adder 150 on the input side of the resonator 110a.

A regulation loop 170, also shown in dashed lines, may be provided between the output S and the input E to stabilise operation of the sigma-delta modulator. In particular, this type of loop may be used to stabilise the amplitude of the output signal when the sigma-delta modulator is used as a signal generator. In the example shown in FIG. 2, the regulation loop is equipped with a regulator 172 with a set value input K, to make a comparison between a characteristic of the output signal available at the output S and a characteristic of the set value applied to the set value input K. For example, it may be a set value representative of an oscillation amplitude. Furthermore, the regulator 172 may comprise filter means.

Note that in the particular embodiment illustrated in FIG. 2, the regulation loop 170 is not directly connected to the input E. The outputs from the regulator 172 and the amplifier 162 are applied to a multiplier 173 to multiply them before they are applied to the input adder 150. When the amplifier 162 comprises a comparator with a logical output 0 or 1, the multiplication consists of applying or not applying the regulator signal to the input.

Figure 3:
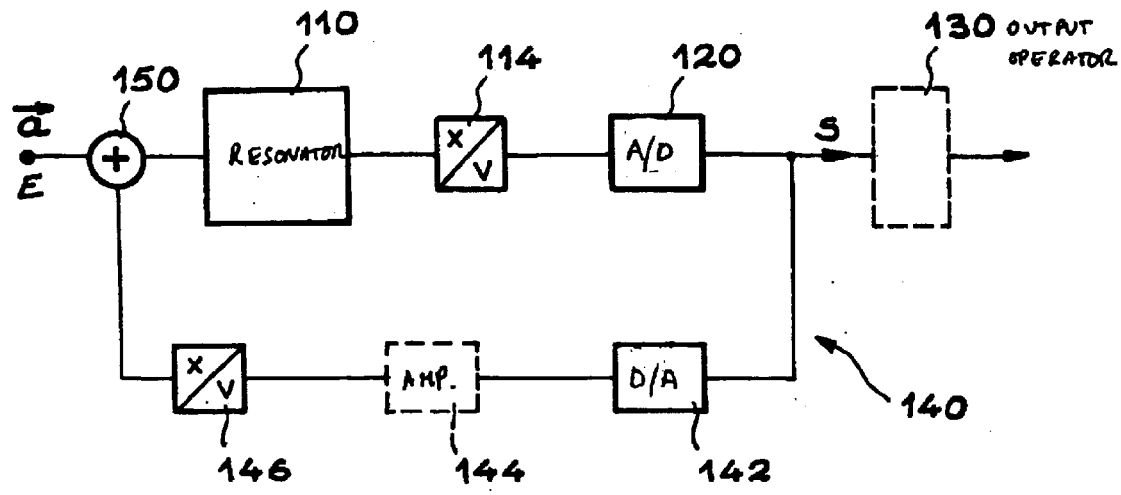

FIG. 3 shows another example of a sigma-delta modulator according to the invention. In this example, it is considered that the resonator 10 is a mechanical resonator with an input that is sensitive to a force or an acceleration $\vec{\alpha}$. The output of the resonator is equipped with an interface 114 capable of converting a mechanical resonance signal into an electrical signal. The electrical signal is then directed towards an analogue-digital converter 120.

Unlike the device in FIG. 2, the signal applied to the input E of the sigma-delta modulator is not an electrical signal, such that there is no need for an interface similar to the interface 112 in FIG. 2. On the other hand, the feedback loop 140 of the sigma-delta modulator in FIG. 3 comprises the digital-analogue converter 142, but also an interface 146 capable of converting an analogue electrical signal output by the digital-analogue converter 142 into a mechanical signal, for example an acceleration, that is compatible with the excitation input of the resonator. An amplifier 144 may be provided between the digital-analogue converter 142 and the interface 146.

For example, it can also be seen that the sigma-delta modulator in FIG. 3 only comprises one resonator 110.

Figure 4:
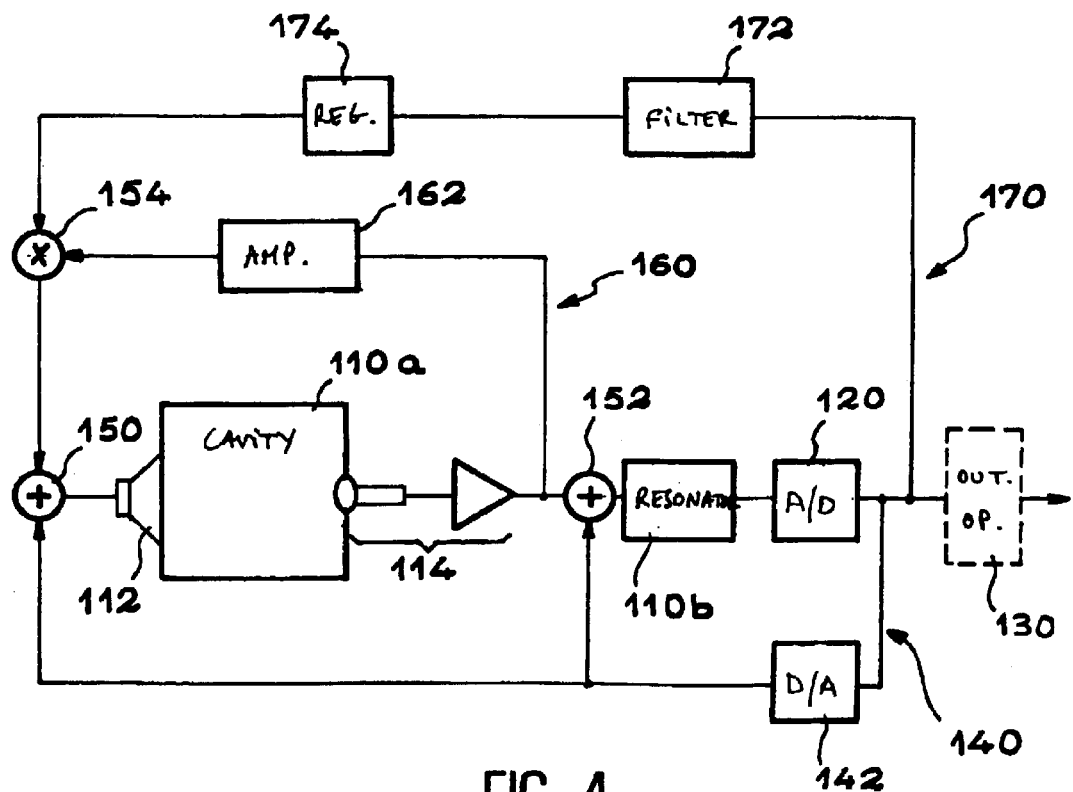
FIGS. 4 to 6 are diagrammatic views illustrating particular uses of sigma-delta modulators according to the invention.

FIG. 4, described below, illustrates a particular embodiment of a sigma-delta modulator according to the invention in which the resonator is an acoustic gyrometre with a silicon cavity. For example document (7) mentioned above contains a description of an acoustic gyrometre.

In FIG. 4, the cavity is marked by reference 110a by analogy with FIG. 2. It actually forms a resonator with a mechanical input, more precisely with an acoustic input and also an acoustic output. A first interface 112 shown in the form of a loudspeaker, consists of a transducer capable of transforming an electrical signal output from an input adder 150, into an acoustic signal applied to the cavity, in other words to the resonator 110a.

A capacitive microphone 114 at the output from the cavity, is associated with an amplifier, and performs the inverse function. It converts an acoustic signal from the cavity into an electrical signal that can be output to an analogue-digital converter 120.

A positive reaction loop 160 equipped with an amplifier 162 and possibly associated with a comparator not shown, reinjects a part of the electrical signal output by the microphone 114 to the input of the cavity 110a through a converter 112. This reaction transforms the resonator into a free oscillator.

The analogue-digital converter 140 described above, and a digital-analogue converter 142 of the feedback loop 140, may be single-bit converters. Furthermore, a second electronic resonator 10b is connected in series with the acoustic gyrometre. These elements are not described further in this disclosure. Further information is given in the description with relation to FIG. 2.

The output from the analogue-digital converter 120 is connected to an output operator 130 that includes an analogue filter capable of transforming the pulse density modulated digital output into an output signal that could for example be sinusoidal. The sigma-delta modulator may for example be used in this way as a signal generator.

The output from the analogue-digital converter 120 is also connected to a regulation loop 170 connected to the input of the first resonator 110a, to stabilise the amplitude of the output signal. A frequency stabilisation is also provided by loop 160.

For example, the regulation loop comprises a decimator filter 172 to convert the modulated signal output from the analogue-digital converter 120, coded on a single bit, into a signal coded on several bits. The decimator is followed by a PID (Proportional Integral Derivative) type regulator 174 that minimises a difference between the output signal, or a characteristic of this signal, and a set value that represents the amplitude to be achieved. The output from the PID regulator is added to or multiplied by the signal from the feedback loop 160. An adder 154 or a multiplier is provided for this purpose. Making this device with a multiplier reduces the cost and also results in efficient operation.

Figure 5:
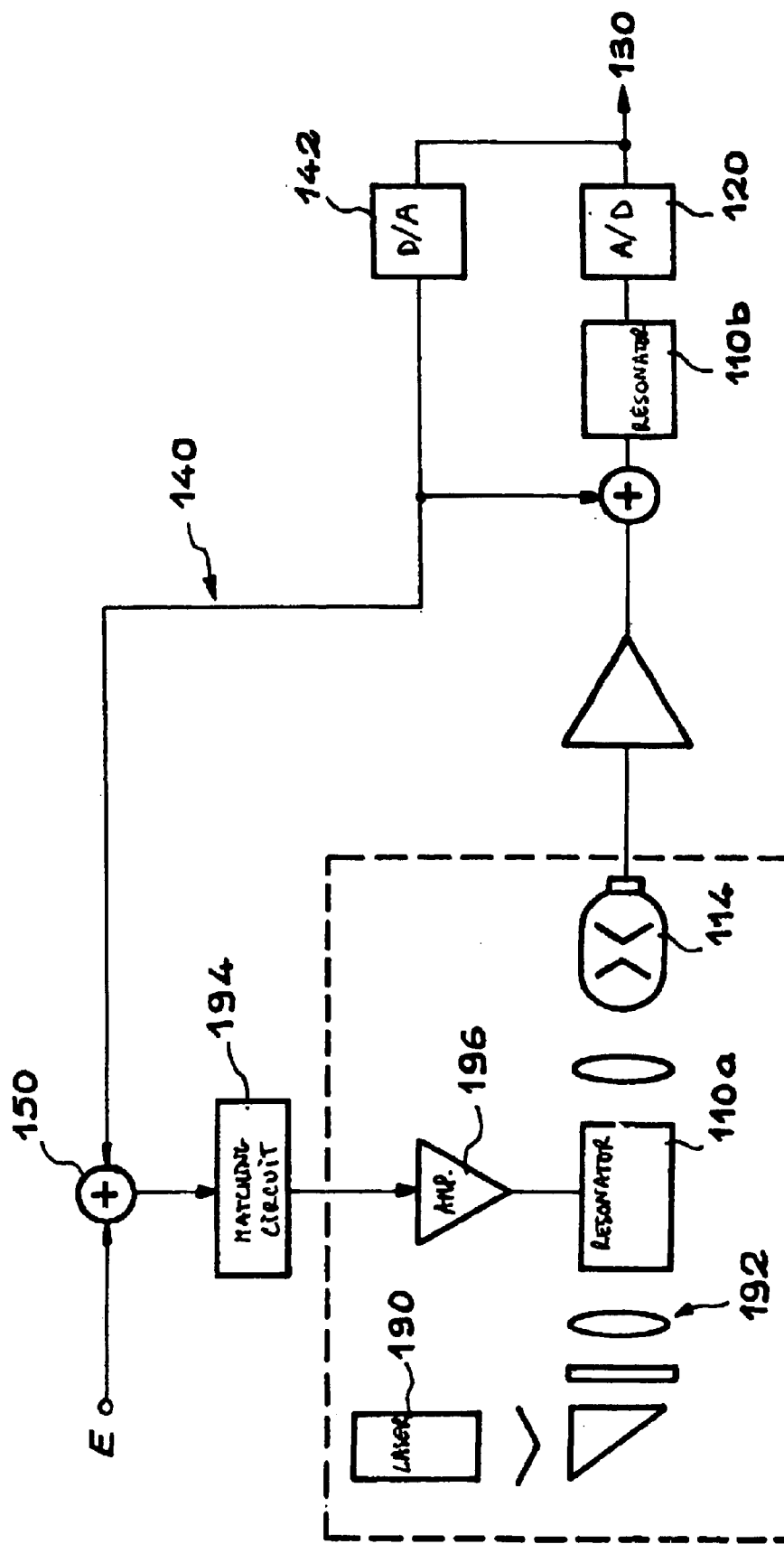

FIG. 5 illustrates the use of a sigma-delta modulator according to the invention to control matching the resonance of a resonator. In the case of the device shown in FIG. 6, the resonator 110a is an electro optic modulator. The resonator has two inputs. A first optical input is connected to an HeNe excitation laser 190 coupled to the resonator through an optical assembly 192 comprised of a prism, a polariser and a lens. A second input is an electrical input connected to the input E of the sigma-delta modulator through a matching circuit 194 and an amplifier 196. The optical output from the resonator is connected to the analogue-digital converter through an optoelectronic interface 114 in the form of a Fabry Pérot interferometer associated with a photodiode and a non-referenced amplifier.

In this particular embodiment of the sigma-delta modulator, the feedback loop 140 is connected to the electrical input of the resonator through an adder 150.

In this application, the resonator (in other words the electro optic modulator) is used to control the modulation frequency of the optical signal.

Figure 6:
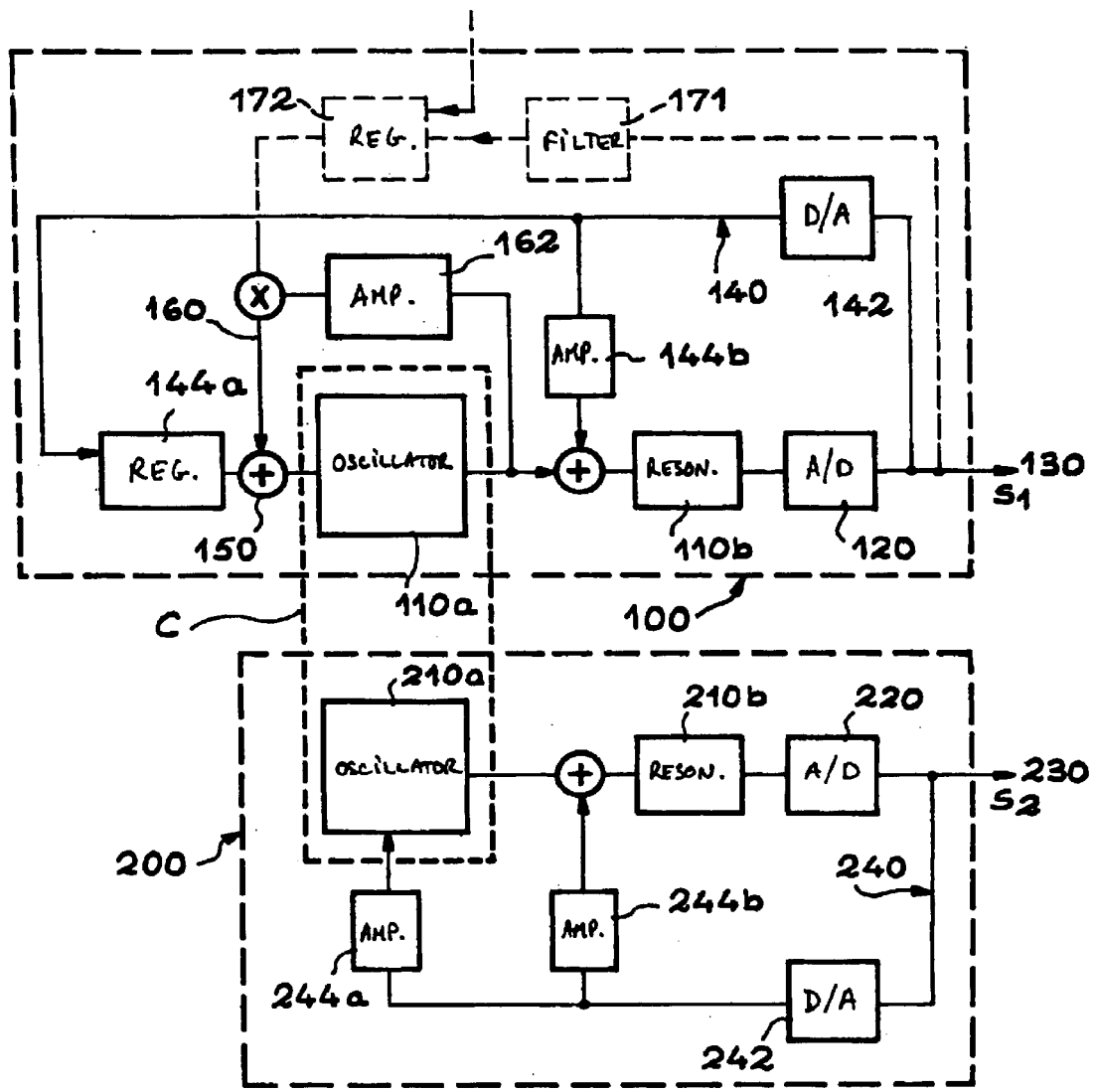

Document (9) gives a more complete description of an electro optic modulator of the type used in the sigma-delta modulator in FIG. 6.

FIG. 6 shows a final particular example of how the invention can be used. FIG. 6 shows a system comprising two coupled sigma-delta modulators 100, 200. This type of vibrating gyrometre is used as a system with two coupled mechanical oscillators. The oscillators are used as a resonator for sigma-delta modulators. The movement of the first mechanical oscillator used for excitation is transmitted to the second oscillator, used for detection by coupling originating from the Coriolis force as described above. This detection applies to an angular rotation speed.

The Coriolis forces, denoted $F_{CORIOLIS}$, may be expressed as follows:

$$\vec{F}_{CORIOLIS} = 2 * m * \vec{V} \wedge \vec{\Omega}$$

In this expression, m denotes the mass of the first mechanical oscillator 110a, V is the velocity of the first mechanical oscillator and $\Omega$ is the rotation speed to be measured. $\Omega$ is deduced from the measurement of the movement of the second oscillator.

Any variation in the excitation, in other words in the velocity V, is reflected in the detection signal. The velocity V is measured to demodulate the detection.

For a given rotation velocity, the output signal is maximum when the second oscillator 210a is at its resonance frequency and the fist oscillator is maximum velocity. Although this is not essential, it is thus preferable if the two oscillators are chosen with a similar or close resonant frequency, in other words not more than a few Hertz apart.

Vibrating gyrometre oscillators may be electrostatically controlled using capacitors. Similarly, the output signal may be established by measuring the change in the capacitance of the capacitors.

Finally, the input and output signals of resonators (in fact the oscillators) are electrical signals. Capacitors, not shown, are used as interfaces and transform the electrical power into electrostatic forces and therefore mechanical displacements, and vice versa.

The numeric references used in the following description are the same as those used in the previous figures to denote elements of the first sigma-delta modulator, and are incremented by 100 to denote similar or equivalent elements of the second sigma-delta modulator.

The first sigma-delta modulator 100 comprises a resonator 110a that, when used with a reaction loop 160 with an amplifier 162, forms the first "excitation" oscillator. This oscillator is slaved to its own resonant frequency. Note that the reaction loop 160 may possibly be eliminated when an outside excitation signal is applied to the input of the first resonator 110a, in other words to the adder 150.

The feedback loop 140 in the first sigma-delta modulator 100 is provided with a regulator 144a with a displacement set value input. The regulator 144a is comparable to the amplifier 144a in FIG. 2, and is designed to apply a feedback to the input of the excitation oscillator 110a. Another amplifier 144b is provided for feedback of the second electronic resonator 10b.

The modulation signal available at the output $S_1$ from the analogue-digital converter 120 of the first sigma-delta modulator is directed to an output operator 130, not shown, to determine the previously mentioned velocity V.

According to one improvement shown in dashed lines, a feedback loop comprising filters 171 and a regulator 172 may be connected between the output S1 and the input of the resonator 110a. The regulator 174 is also provided with a set value input.

The second sigma-delta modulator 200 comprises a resonator 210a mechanically coupled to the resonator 110a of the first sigma-delta modulator 100. Coupling is indicated in the figure shown in dashed lines C.

References 210b, 220, 240, 242, 244a and 244b denote parts equivalent to parts 110b, 120, 140, 144a and 144b described above or in relation with FIG. 2. Therefore, their description is not repeated.

Output $S_2$ from the analogue-digital converter 220 of the second sigma-delta modulator 200 is also directed to an output operator 230, not shown, to produce an output signal representing the Coriolis force.

A computer may be provided to establish the rotation velocity Ω mentioned above using the Coriolis force data and the velocity V.

REFERENCE DOCUMENTS (1)
"Multi-purpose interface for sensor systems fabricated by CMOS technology with post-processing", Carlos Azeredo Leme at Henry Baltes, Sensors and Actuators A.37–38 (1993) 77–81, © 1993, Elsevier Sequoia.

(2)
"A 2.5 MHz 55 dB Switched-current BandPass ΣΔ Modulator for AM signal Conversion", J. M de la Rosa, B. Pérez-Verdù, F. Medeiro, and A. Rodriguez-Vazquez, Instituto de Miceoelectronica de Sevilla—CNM. ESSCIRC'97, Paris, *France, pp. 156–159

(3)
"A 10.7 MHz N-path fourth-order Bandpass Sigma-Delta Modulator" Fabrizio Francesconi, Valentiono Liberali, and Franco Maloberti, Micronova Sistemi S.r.l. ESSCIRC'96, pp. 156–159

(4)
"An Eight-order bandpass ΣΔ Modulator for A/D Conversion in Digital Radio", Loai Louis, John Abcarius and Gordon W. Roberts, IEEE JOURNAL OF SOLID-STATE CIRCUITS, Vol. 34 No. 4, APRIL 1999

(5)
"An Investigation of Bandpass Sigma-Delta A/D Converters" Yvan Botteron and Behrouz Nowrouzian, 1997IEEE, Proceedings of the Midwest Symposium on circuits and systems, vol. 1, pp. 293.6

(6)
"Bandpass Sigma-Delta Modulator for wideband IF signals" Luca Daniel, Marco Sabatini, Bandpass Sigma-Delta Modulator for wideband IF signals, Jun. 10, 1999.

(7)
"Preliminary Results on a Silicon Gyrometre Based on Acoustic Mode Coupling in Small Cavities"Tarik Bourouina, Anne Exertier, Serge Spirkovitch, Bernard Chaumet and Eric Pleska, JOURNAL OF MICRO-ELECTROMECHANICAL SYSTEMS, vol. 6, No. 4, December 1997

(8)
"OPTICAL SYSTEM FOR PRESSURE AND TEMPERATURE SENSING" K. Seibert, D. Largeau, B. Bonvalot and D. T Angelidis, P. parsons, The 7th International Conference on Solid-State Sensors and Actuators.

(9)
"RESONANTLY ENHANCED RADIO FREQUENCY ELECTROOPTIC PHASE MODULATOR"Chi Man Shum and Edward A. Whittaker, APPLIED OPTICS, Vol. 29, No. 3, Jan. 20, 1990.

(10)
"An Integrated CMOS Micromechanical resonator High-Q Oscillator", Clark T.-C Nguyen, Member, IEEE and Roger T. Howe, IEEE JOURNAL OF SOLID-STATE CIRCUITS, VOL. 34, No. 4, April 1999, ©1999 IEEE.

(11)
"High-Accuracy circuits for On-chip Capacitance ratio Testing or Sensor Readout, Yumin Cao and Gabor C. Temes, IEEE TRANSACTIONS ON CIRCUITS AND SYSTEMS-II: ANALOG AND DIGITAL SIGNAL PROCESSING, Vol. 41, No. 9, September 1994, ©1994 IEEE.

(12)
WO-98/27402

What is claimed is:

1. Sigma-delta modulator comprising:
at least one resonator,
a converter to convert an analogue signal from the resonator into a digital signal with time information, and
a feedback loop connecting an output of the converter to an excitation input of the resonator,
characterised in that at least one resonator in the modulator is chosen from among the group comprising mechanical, acoustic, electromechanical, electrostatic, optical and chemical resonators.

2. Sigma-delta modulator, in which the resonator has a mechanical, optical or acoustic excitation input and in which the feedback loop is connected to the excitation input through a signal electromechanical interface, a signal electro acoustic interface, or a signal electro-optic interface, respectively.

3. Sigma-delta modulator according to claim 1, in which the resonator is a free oscillator and is equipped with a reaction loop connecting a resonator output to a resonator excitation input.

4. Modulator according to claim 1, comprising a regulation loop connecting an output of the modulator to an excitation input of the resonator.

5. Sigma-delta converter comprising a modulator according to claim 1 and bandpass filter means connected to an output of the modulator.

6. Device for analogue-digital conversion of a signal comprising an analogue signal input (E) and a sigma-delta converter according to claim 5, the analogue signal input being connected to the resonator excitation input.

7. Device according to claim 6, in which the analogue input is connected to the excitation input through an electromechanical interface or electro optic interface or electro acoustic interface.

8. Signal generator comprising a sigma-delta modulator according to claim 1, in which at least one resonator is a free oscillator.

9. Device for measuring a physical magnitude comprising a detection resonator sensitive to said physical magnitude and a sigma-delta modulator according to claim 1, including said detection resonator.

10. Measuring device according to claim 9, in which the detection resonator is a free oscillator.

11. Measuring device according to claim 9, comprising means of exciting the detection resonator with a second resonator called excitation resonator, coupled to the detection resonator.

12. Device according to claim 11, comprising a second sigma-delta modulator including the excitation resonator.

13. Measuring device according to claim 9, in which the detection resonator is coupled to the excitation resonator through a physical magnitude.

14. Device according to claim 13, in which the physical magnitude is a Coriolis force.

15. Use of a sigma-delta modulator according to claim 1 in a device chosen from among an analogue-digital converter, a physical magnitude detector and a signal generator.

* * * * *